United States Patent [19]

Streit et al.

[11] 4,004,160
[45] Jan. 18, 1977

[54] SWITCHING SYSTEM TO SHORT-CIRCUIT A LOAD WITH MINIMUM RESIDUAL VOLTAGE

[75] Inventors: Klaus Streit, Tubingen; Karl Staiger, Wannweil; Gerhard Conzelmann, Leinfelden; Hartmut Seiler, Reutlingen; Karl Nagel, Gomaringen, all of Germany

[73] Assignee: Robert Bosch G.m.b.H., Stuttgart, Germany

[22] Filed: Sept. 12, 1974

[21] Appl. No.: 505,470

[30] Foreign Application Priority Data

Sept. 28, 1973   Germany ......................... 2348765

[52] U.S. Cl. ........................... 307/253; 307/202 R; 307/237; 307/296
[51] Int. Cl.² ......................................... H03K 17/00
[58] Field of Search ............... 307/254, 237, 299 B, 307/202, 296, 297; 328/104; 357/415; 323/9, 27

[56] References Cited

UNITED STATES PATENTS

| 3,742,256 | 6/1973 | Frederiksen et al. ......... 307/299 B |
| 3,794,926 | 2/1974 | Skingley et al. .................... 328/104 |
| 3,822,387 | 7/1974 | Mulder .......................... 307/299 B |
| 3,868,517 | 2/1975 | Schoeff .............................. 307/237 |

Primary Examiner—Stanley D. Miller, Jr.
Assistant Examiner—B. P. Davis
Attorney, Agent, or Firm—Flynn & Frishauf

[57] ABSTRACT

A controlled main switch, typically a semiconductor switch, is connected in parallel to the load. In accordance with the invention, an auxiliary switch, typically also a semiconductor switch such as a switching transistor is directly connected across the terminals of the load, and with an impedance, for example a resistance, diode, or Zener diode to the main switch, and controlled to switch in synchronism with the main switch, so that the residual voltage across the load due to inherent voltage drop across the terminals of the switch becomes a minimum. Integrated technology may be used, combining preamplifiers and distribution networks in one monolithic chip.

24 Claims, 25 Drawing Figures

Fig. 4a       Fig. 4b

SWITCHING SYSTEM TO SHORT-CIRCUIT A LOAD WITH MINIMUM RESIDUAL VOLTAGE

MATHEMATICAL RELATIONSHIPS:

$$U_r = \frac{r_c}{R + r_c} \cdot U_B \quad (1)$$

$$R' + R_v = R \quad \ldots \quad (2)$$

$$U_{rl} = \frac{r_{cl}}{R_v + r_{cl}} U_r \approx \frac{r_{cl}}{R_v + r_{cl}} \cdot \frac{r_c}{R_v + r_c} \cdot U_B \quad (3)$$

$$r_c = r_{CC} + r_{CL} + r_{CE} \quad \ldots \quad (4)$$

$$U_{CEsat} = r_c \cdot I_C + U_{CEsato} \quad \ldots \quad (5)$$

$$U_{CEsat} = (r_{CC} + r_{CL} + r_{CE}) \cdot I_C + U_{CEsato} \quad \ldots \quad (6)$$

The present invention relates to a circuit arrangement to short-circuit a load by using a controlled switch, typically a semiconductor switch, having a main electrode connected to a source of supply.

Various circuit arrangements have been proposed in which one main terminal of a controlled switch is connected in parallel to a main terminal of the load, the second terminal of the controlled switch, as well as the second terminal of the load being connected to a fixed voltage of the circuit, for example to a reference voltage, such as ground or chassis connection. Upon control of the switch to close, the load is short-circuited, and thereby disconnected. The known switches of this type, even when closed, have some internal resistance which differs from zero, or null, so that a remanent voltage will remain which is applied across the load, even though the controlled switch is closed, that is, effectively short-circuits the load. This remaining inherent voltage, due to the voltage drop across the switch may, however, be sufficient to keep the load still in operation; in other words, this remaining voltage may have as a result that the load is not completely disconnected, or may not be disconnected at all, even though the controlled switch is closed, so that it is intended to short-circuit the load.

In is an object of the present invention to provide a circuit arrangement in which the remaining switch voltage is a minimum so that voltage sensitive loads can be effectively short-circuited.

SUBJECT MATTER OF THE PRESENT INVENTION

Briefly, a second controlled switch is provided, forming what may be termed an auxiliary switch, and connected to switch in synchronism with the main switch. The second, or auxiliary switch has its two main terminals or electrodes connected directly across the terminals of the load; one terminal of the auxiliary switch, and hence one terminal of the load is connected over a two-terminal circuit to the first main terminal of the main switch. Thus, the two-terminal circuit is interposed between the main switch and the auxiliary switch. Other main terminals of the auxiliary switch and the main switch, as well as of the load can be connected directly together, for example by all being connected to ground or chassis, galvanically. The control electrodes of the two controlled switches can be connected to a common control network over a decoupling network, or can be controlled directly from common junction. The control electrode of the second control switch may, also be connected to the output electrode of the main switch, the control electrode of the main switch then providing control voltage for the auxiliary switch as well.

In accordance with a feature of the invention, the switches are arranged on a monolithic integrated circuit by using a monolithic integrated vertical transistor which has a conductive zone located beneath its collector region or zone, and whose collector electrode is connected with a source of current; the emitter of the monolithic vertical transistor is connected to the second input electrode of the load. The vertical transistor has one collector electrode connected to the source, and a second collector electrode which is connected to the first input electrode of the load. The invention will be described by way of example with reference to the accompanying drawings, wherein:

FIG. 4a is a fragment of the circuit of FIG. 4, and illustrating a modification;

FIG. 4b is a fragment of the circuit of FIG. 4, illustrating another modification;

Figure 1:
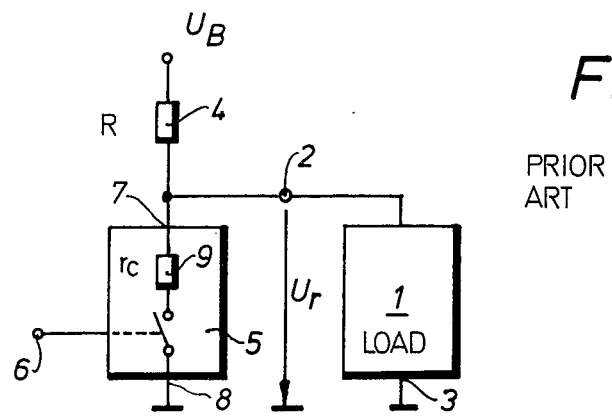
FIG. 1 is a highly schematic block diagram showing the equivalent circuit of a controlled switch, short-circuiting a load, in accordance with the prior art.

A load 1 (FIG. 1) having main load terminals 2, 3, is connected over a resistor 4 to a source of supply $U_B$. Load terminal 3 is connected to ground or chassis. A controlled switch 5, having a control electrode 6, has its main terminals 7, 8 connected across the terminals of the load 2, 3, that is, to resistor 4 and to ground. When the controlled switch 5, as shown in FIG. 1, is open (that is, if switch 5 is a transistor, its conduction is blocked) then load 1 is connected through resistor 4 to the source $U_B$. Upon controlling switch 5 to close, that is, if switch 5 is a transistor to conduct, the load 1 is to be disconnected by short-circuiting the supply voltage across the load 1. Under ideal conditions, the terminal 2 should have the same terminal as ground, that is, the voltage at terminal 2 with respect to ground should entirely disappear. This can be obtained only with an ideal switch. Actually, however, since switch 5 is not an ideal switch but, rather, has an inherent, internal resistance 9 of value $r_c$, a remaining voltage $U_r$ will appear between terminals 2 and 3. This remaining voltage, if the inherent resistance 9 is large enough, may be sufficient not to disconnect load 1, but rather to maintain it in connected state.

Figure 2:
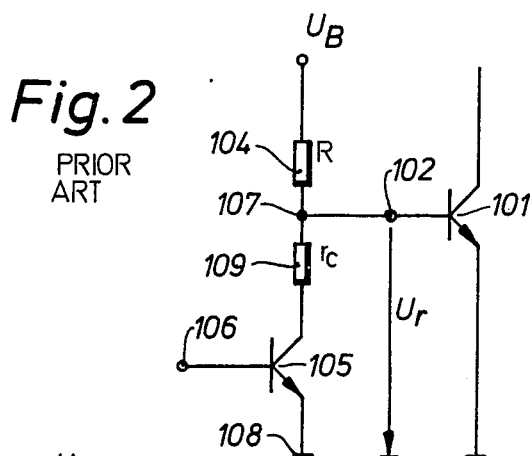
FIG. 2 is a specific embodient of the circuit of FIG. 1.

FIG. 2 illustrates a typical circuit. The load 1 is formed by the emitter-base path of an NPN transistor 101. The controlled switch 5 is an NPN transistor 105, having its collector 107 connected to the base terminal 102 of the transistor 101, and having its emitter terminal 108 connected to ground. The base 106 of the main, or switching transistor 105 forms the control electrode 6 (FIG. 1); the collector-emitter internal resistance of the transistor is, again, illustrated by equivalent resistor 109, the resistance of which, when the transistor 105 is conductive, has the value $r_c$. The resistance of the resistor 104, connected between terminals 102, and 107, respectively, and the source $U_B$ is R. If the transistor 105 is controlled to be conductive, then the voltage between the base terminal 102 of transistor 101 and ground, namely voltage $U_r$, is defined by relationship (1).

Figure 3:
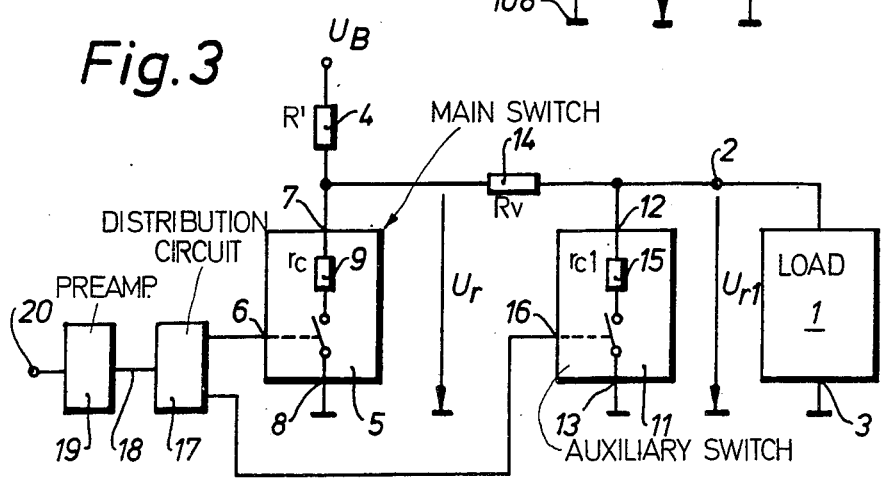
FIG. 3 is the general circuit diagram of the circuit in accordance with the present invention, and illustrating, in part, the equivalent circuit for some of the components.

In accordance with the present invention, the remaining voltage is decreased. FIG. 3 illustrates the circuit in which the remaining voltage across load 1, $U_{r1}$, has been decreased over the voltage $U_r$ of FIG. 2. A controlled switch 5, as in FIG. 1, having a main terminal 7, is connected over resistor 4 of resistance value R' with a supply voltage $U_B$. The other main terminal 8 of switch 5 is grounded. To decrease the remaining voltage across load 1, the second main terminal 3 of which is likewise connected to ground, a second or auxiliary controlled switch 11 is provided having one electrode 13 thereof also connected to ground. The other electrode 12 of the second or auxiliary switch 11 is connected with the main terminal 7 of the main switch 5 through a two-terminal circuit 14. The electrode 12 of the auxiliary switch 11 is directly connected to the input terminal 2 of the load 1. The second or auxiliary switch 11, when closed, has an inherent, internal resistance $r_{c1}$, schematically illustrated by resistor 15 (FIG. 3). The control electrode 6 of the main switch 5 and the control electrode 16 of the auxiliary switch 11 are both connected to a distribution circuit 17, which may be a decoupling network, a junction, or the like, so that both switches are synchronously controlled. The control input of the distribution circuit 17 can be connected to a pre-amplifier 19, the input to which is indicated at 20. The two-terminal circuit 14, in its simplest form, is merely an ohmic resistance 114 (FIG. 4), or it may be a diode 114a (FIG. 4a) or a Zener diode 114b (FIG. 4b).

When both controlled switches 5 and 11 are open - as shown in FIG. 3 - then the first main terminal 2 of the load 1 is connected to the source $U_B$ over resistor 4 and the circuit 14. Load 1 is connected. When both controlled switches 5 and 11 are closed, then the remaining voltage $U_r$ of the first controlled switch 5 is divided down over the circuit 14 and the internal resistance 15 of the second controlled switch 11 to an output remaining voltage $U_{r1}$, which will be less than the voltage $U_r$. In effect, resistor 14 of value $R_v$ and the internal resistance 15 of value $r_{c1}$ of the switch 11 function as a voltage divider. Thus, the remaining voltage $U_{r1}$ across load 1 is less than the voltage $U_r$, and the load 1 is reliably short-circuited, and thus rendered inoperative.

The principle of dividing the remaining voltage can be cascaded by the use of a plurality of auxiliary switches; the remaining voltage across load 1 will become less and less as the number of controlled auxiliary switches increases.

Figure 4:
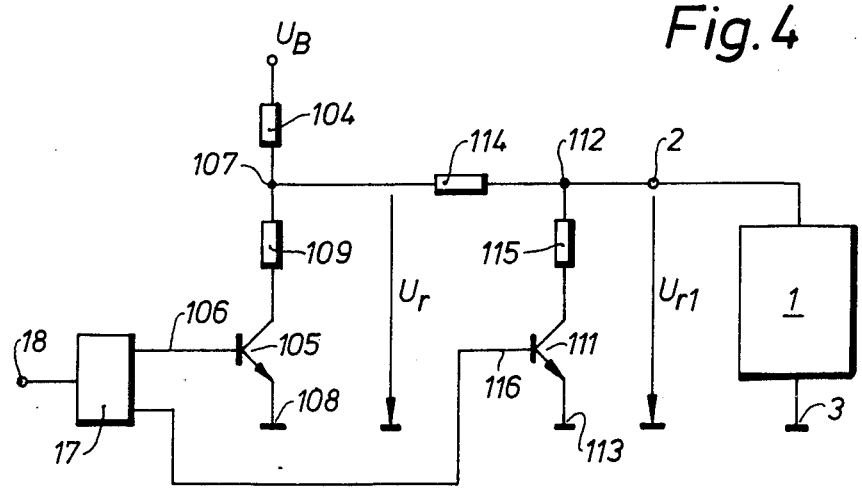
FIG. 4 is a detailed circuit in accordance with the present invention.

FIG. 4 illustrates the specific circuit in which the main switch 5 is formed by an NPN transistor 105, and the auxiliary switch 11 is formed by an NPN transistor 111. The collectors 107, 112 of the transistors 105, 111 are connected together through a resistor 114. The collector 107 of the first NPN transistor 105 is connected through resistor 104 with the supply voltage $U_B$; the collector 112 of the auxiliary transistor 111 is connected to the first input terminal 2 of the load 1. The bases 106, 116 of the two NPN transistors 105, 111 are connected to a distribution network 17 which includes a decoupling network. The emitters 108, 113 of the transistors 105, 111 are grounded, as is the other terminal 3 of load 1, so that terminals 3, 108, 113 are galvanically connected.

OPERATION

When the two transistors 105, 111 are in non-conductive (blocked) condition, then the first terminal 2 of load 1 is connected to the source $U_B$ through resistors 114 and 104. The load is connected. If the current to be supplied to the load 1 is to have the same value as that for the circuit of FIG. 2, with equal supply voltage $U_B$, then the resistance values R' of resistor 104 and $R_v$ of resistor 14 must satisfy equation (2). When the transistors 105, 111 are controlled to be conductive, then the remaining voltage $U_r$ of the main switching transistor 105 is divided down by the resistance 114 and the collector-emitter resistance 115 of the auxiliary NPN transistor 111 to result in a remaining voltage $U_{r1}$ across load 1, which is less than the voltage $U_r$. The load is switched off. The remaining output voltage $U_{r1}$ is derived from equation (3), in which $r_{ci}$ is the collector-emitter resistance of transistor 111, when conductive, and shown as the equivalent resistance by resistor 115 in FIG. 4.

Figure 5:
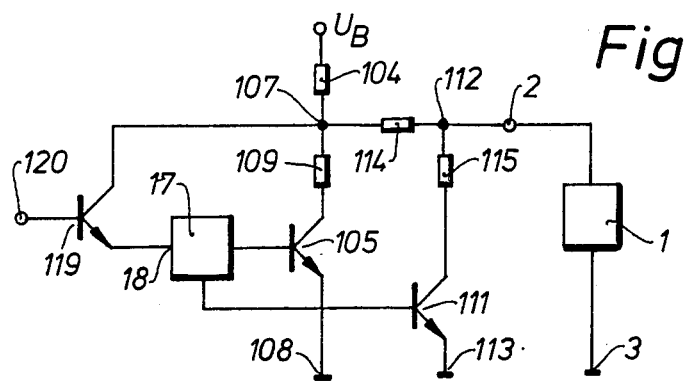
FIG. 5 is another embodiment of the circuit of FIG. 4.

The embodiment of FIG. 5 is similar to the embodiment of FIG. 4; the distribution network 17 forms a decoupling network and a pre-amplifier stage formed by an NPN transistor 119 is connected in advance of the distribution network 17; the emitter of transistor 119 is connected to the control input 18 of the distribution network 17; the collector of the transistor 119 is connected to the collector 107 of the NPN main switching transistor 105; the base 120 of transistor 119 forms the control input for the pre-amplifier stage.

Figure 6:
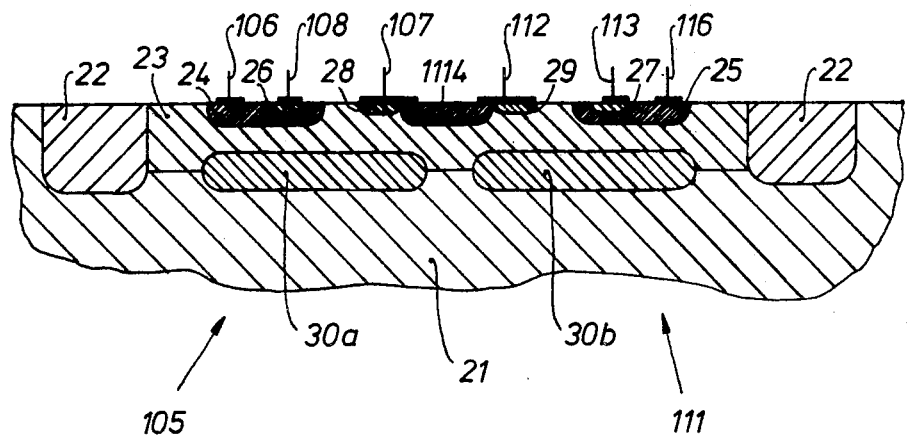
FIG. 6 is a schematic cross-sectional view through a monolithic chip illustrating the switching transistors of FIG. 4 and a resistance between the collector terminals thereof, constructed according to monolithic integrated technology.

The circuits of FIGS. 4 and 5 are particularly adapted for integration by monolithic integrated circuit technology. Transistors 105 and 111, and the resistor 114 may, as customary, be located in separate depressions or troughs. FIG. 6 illustrates, in cross section, an embodiment in which these elements are located in a shingle trough. A p-conductive semiconductor material of a silicon base forms the substrate 21. An n-conductive epitaxial layer is applied to the substrate 21. An n-conductive trough 23 is separated from the epitaxial layer by means of a $p^+$ which is diffused into the epitaxial layer up to the substrate 21. The isolating diffusion zone 22 forms a closed ring, for example in form of a closed, rectangular frame. The p-conductive base zones 24 and 25 of the two transistors 105, 111, and the resistance element 1114, formed likewise as a p-conductive zone, are diffused into the n-conductive trough 23 in one step. The resistance element 1114 is located between the two base zones 24, 25. The $n^+$ emitter zone 26 of the first transistor 105, the $n^+$ emitter zone 27 of the second transistor 111, the $n^+$ collector contracting diffusion zone 28 of the first transistor 105 and the $n^+$ collector contacting diffusion zones 29 of the second transistor 111 are formed in a single diffusion step. The collector contacting diffusion zones 28, 29 are diffused into the trough 23, and the two emitter zones 26, 27 are diffused in the two base zones 24, 25. The zones 28, 29 are so arranged that they touch the resistance element 1114 at two opposite ends. Metallizations 106, 116; 108, 113, 107 and 112 are applied on zones 24, 25, 26, 27, 28, 29, the metallizations forming outer terminals. The collector metallizations 107, 112 of the two transistors 105, 111 cover not only the collector contacting diffusion zones 28 and 29 but, partially, also the p-conductive resistance zone 1114. A $n^+$ conductive layer 30, sub-divided into two sub-portions 30a and 30b, is located between the trough 23 and the substrate 21, formed as a buried layer. The first portion 30a is associated with the first transistor 105 and is beneath the structure formed by zones 24, 26, 28. The second portion 30b is beneath the structure formed by zones 25, 27, 29 and is associated with the auxiliary transistor 111. The separate conductive zones 30a and 30b electrically isolate the collectors of the two transistors 105, 111.

The resistance zone 1114, as a separate structure, may be omitted; the ohmic resistance 114 can be formed by collector material which is located between the two collector contacting diffusion zones 28, 29. In this case, metallizations 107 and 112 must be limited to the zones 28, 29 themselves.

Figure 7:
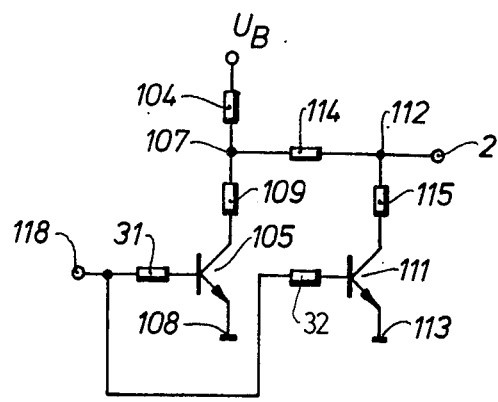
FIG. 7 is an embodiment of the basic circuit of FIG. 4 with a particularly simple system to control the switching transistors.
Figure 8:
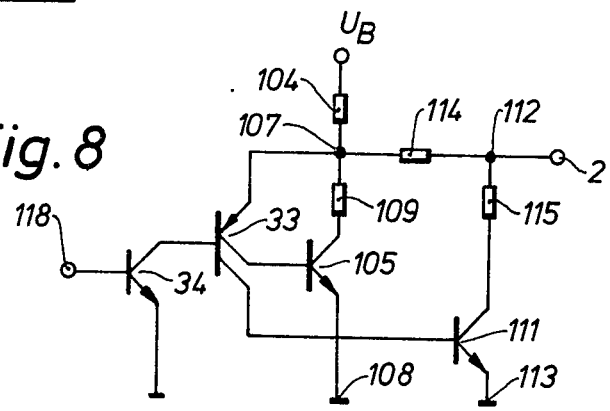
FIG. 8 is a circuit according to FIG. 4, and illustrating one form of decoupling network.
Figure 9:
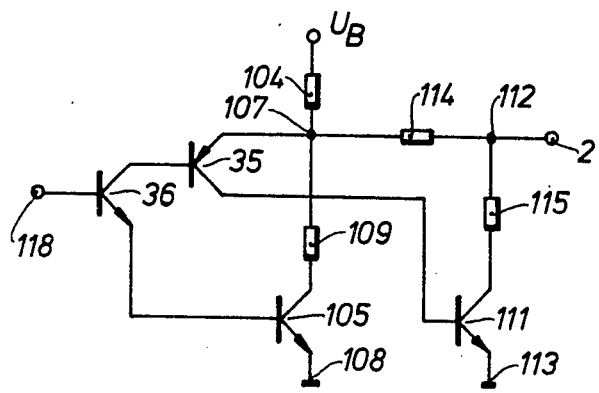
FIG. 9 is a circuit similar to FIG. 4, showing another embodiment of a decoupling network.

The distribution network 17 may have various forms, and FIGS. 7–9 show a distribution network in which decoupling between the transistors 105, 111 is obtained. The circuit, insofar as previously described, and the components thereof have been given the same reference numerals and will not be described again.

FIG. 7: The decoupling network includes two separate base resistors 31, 32 connected to a common control input 118.

FIG. 8: The decoupling network includes a PNP lateral transistor 33 having two collectors, and an NPN pre-controlled transistor 34. The collectors of the PNP lateral transistor 33 are, each, connected to a respective base of the transistors 105 and 111. The emitter of the PNP lateral transistor 33 is connected to the collector 107 of the transistor 105. The base of the transistor 33 is connected to the collector of the NPN pre-transistor 34. The emitter of transistor 34 is grounded. The base of transistor 34 is connected to input 118, forming the control input to the distribution network. The entire circuit of FIG. 8 may be made by monolithic integrated technology; in many instances, the NPN control transistor 34 may not be necessary and may be omitted.

FIG. 9: The distribution network includes a PNP transistor 35 to control transistor 111 and an NPN transistor 36 to control transistor 105 and transistor 35. The emitter of transistor 35 is connected to the collector 107 of the transistor 105; the collector of the transistor 35 is connected to the base of the transistor 111. The collector of transistor 36 is connected to the base of the transistor 35, the emitter of the transistor 36 is connected to the base of transistor 105 and the base of transistor 36 is connected to the control input 118 of the distribution network.

Figure 10:
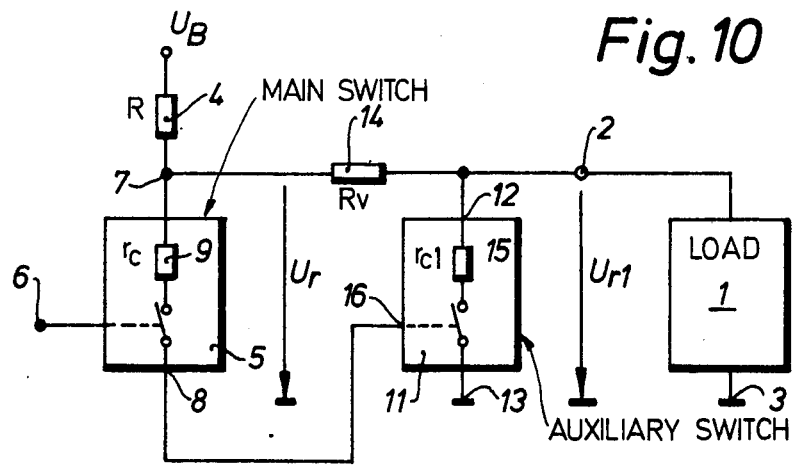
FIG. 10 is a basic block diagram, similar to FIG. 3, illustrating another embodiment with a different control circuit for the auxiliary switch.

FIG. 10 illustrates an equivalent circuit which is similar to the circuit of FIG. 3 to decrease the remaining voltage across load 1, the difference being that the auxiliary switch 11 is controlled from the output of the main switch 5. The first main switch 5 has one of its main terminals connected over resistor 4 of resistance R' to the supply voltage $U_B$. To decrease the remaining voltage $U_r$ across the load, the second main terminal 8 of the first main switch 5 is connected to the control electrode 16 of the auxiliary switch 11. The control electrode 6 of the main switch 5, when controlled to conduct, thus will in turn control the auxiliary switch 11. When the main switch 5 is closed, it will have an internal resistance shown as the equivalent resistance 9; the second or auxiliary switch 11 will have an internal resistance 15.

Figure 11:
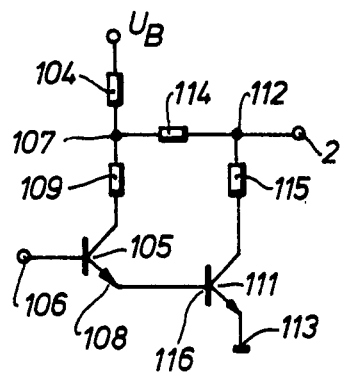
FIG. 11 is a specific circuit diagram of an embodiment of the basic circuit of FIG. 10.
Figure 12:
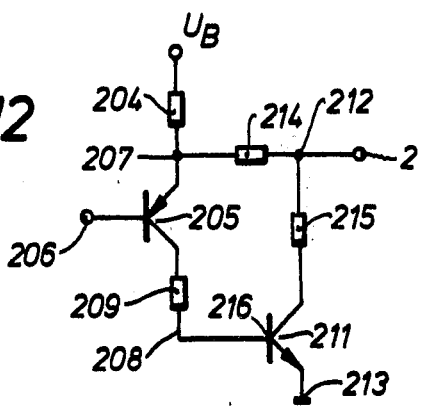
FIG. 12 is another specific embodiment of the circuit of FIG. 10.

Circuits in accordance with FIG. 10 are shown in FIGS. 11 and 12. The remaining voltage $U_r$ of the main switch 5 is increased by one diode dropping voltage. By dividing the remaining voltage over resistance 14 and over the second switch 11, the final remaining output voltage $U_{r1}$, appearing across the switch, can be made sufficiently small.

FIG. 11: NPN transistors 105, 111 form the switches 5, 11; the collectors 107, 112 are connected together over a resistor 114. Collector 107 of the main NPN transistor 105 is further connected over resistor 104 with supply voltage $U_B$; the collector 112 of the auxiliary NPN transistor 111 is connected to the one terminal 2 of load 1. The emitter 108 of the main transistor 105 is connected to the base 116 of the auxiliary transistor 111; the emitter 113 of the auxiliary transistor 111 is grounded. Base 106 of the main transistor 105 is used to synchronously control conduction, or non-conduction of both NPN transistors 105, 111. This circuit is similar to the well-known Darlington circuit. By subdividing the collector voltage $U_r$ of the first NPN transistor 105 by the resistances 114, 115 (115 being the equivalent internal resistance of transistor 111) provides for a much smaller remaining voltage $U_{r1}$.

FIG. 12: The main switch 5 is formed by a PNP transistor 205; the second. or auxiliary switch 11 is formed by an NPN transistor 211. The collector-emitter resistance of the PNP transistor 205 is shown at the equivalent resistance 209; the collector-emitter resistance of the NPN transistor 211 is shown as the equivalent resistance 215. The emitter 207 of transistor 205 is connected over resistor 214 with the collector 212 of the transistor 211; the emitter 207 of the transistor 205 is further connected over resistor 204 with the supply voltage $U_B$. The collector 212 of the auxiliary transistor 211 is connected to the main terminal 2 of the load 1. The collector 208 of the main transistor 205 is connected to the base 216 of the auxiliary transistor 211; the emitter 213 of the auxiliary transistor 211 is grounded. The base 206 of the main transistor 205 is connected to control terminal 206, for synchronous control of the complementary transistors 205, 211. This circuit is similar to the well-known Lin circuit. By sub-dividing the emitter voltage $U_r$ of the transistor 205 by the resistor 214 and the equivalent resistance 215, a much smaller remaining output voltage $U_{r1}$ is obtained.

Figure 13:
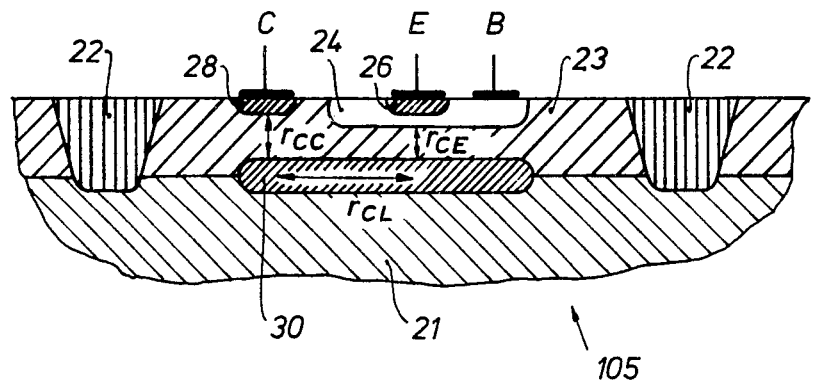
FIG. 13 is a cross-sectional view of a monolithic integrated vertical NPN transistor.
Figure 14:
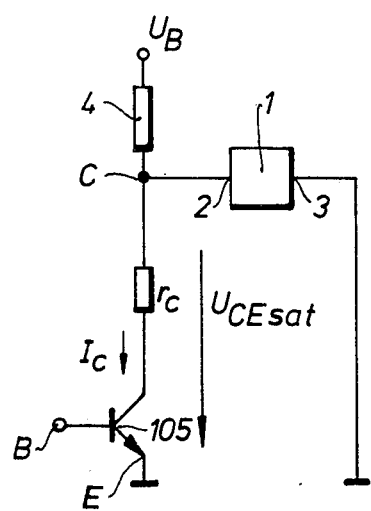
FIG. 14 is the equivalent circuit of the NPN transistor of FIG. 13.
Figure 15:
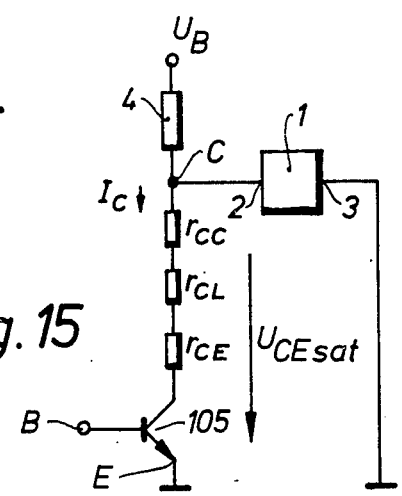
FIG. 15 illustrates the distribution of the collector resistance of the NPN transistor of FIG. 13, shown in lumped form in FIG. 14.

FIG. 13 illustrates the normal arrangement of various conductive zones in a monolithic vertical NPN transistor 105, which may be used in the circuit of FIG. 2 as switching transistor to short-circuit the emitter-base path of a load transistor 101; it may be used in the circuit of FIG. 1 as the controlled switch 5 to short-circuit the load 1. The substrate 21 in FIG. 13 is a p-substrate, for example silicon. An n-conductive zone is epitaxially applied on the substrate 21. $p^+$ isolating diffusion zones 22 are diffused into the n-conductive zone, to separate from the epitaxial layer an n-conductive trough 23, which forms the collector zone of the vertical transistor 105. A conductive layer 30 is further introduced in the junction between the n-conductive trough 23 and the substrate 21. The p-base 24 is diffused in the n-trough. The $n^+$ emitter 26 is diffused into the base 24 of the vertical transistor 105. The transistor additionally has a collector contacting diffusion zone 28, formed of $n^+$ material and diffused into the trough 23. Zone 28 may be made simultaneously with zone 26. The transistor additionally has a collector terminal C, an emitter terminal E, and a base terminal B. These terminals correspond to the terminals 107, 108, 106 of FIG. 2, respectively. The portion of the collector-emitter resistance $r_c$ which is below the collector terminal C in the trough 23 is indicated as $r_{CC}$. The portion of the collector-emitter resistance which is within the conductive layer is indicated as $r_{CL}$; the portion of the collector-emitter resistance which is beneath the emitter 26 of the trough 23 is indicated as $r_{CE}$. The overall collector-emitter resistance $r_c$ is then defined by formula (4). The conductive layer 30 is highly conductive with respect to the epitaxial material of the trough 23. The collector current thus flows from the collector contacting diffusion zone 28 straight down to the conductive zone 30, and then horizontally in the conductive zone 30 until it reaches the region beneath the emitter 26, and then the current flow vertically upwardly to the emitter 26. Saturation voltage of the transistors is defined by formula (5), in which $I_C$ is the collector current and $U_{CEsato}$ is the inner or inherent saturation voltage of the transistor. The distribution of the collector resistance, shown on the diagram of FIG. 13, is generally illustrated in the equivalent circuit of FIG. 14, and in detail in the equivalent circuit of FIG. 15. The saturation voltage in accordance with the diagram of FIG. 15 is defined by formula (6).

Figure 16:
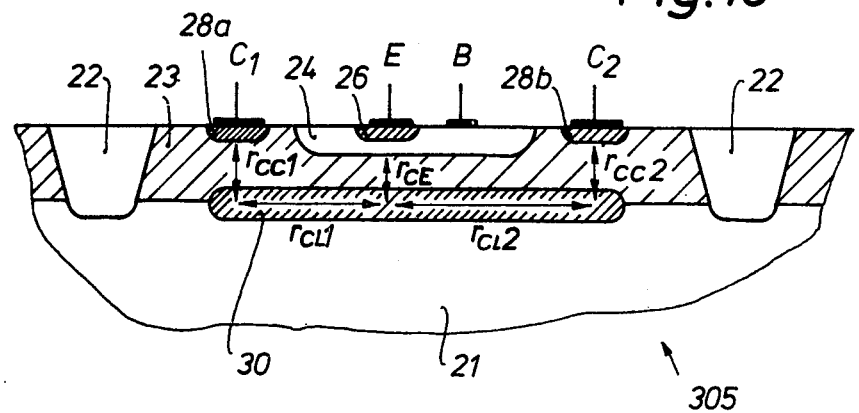
FIG. 16 is a cross-sectional view through a monolithic integrated vertical NPN transistor having a second collector terminal to decrease the remaining voltage across the load.
Figure 17:
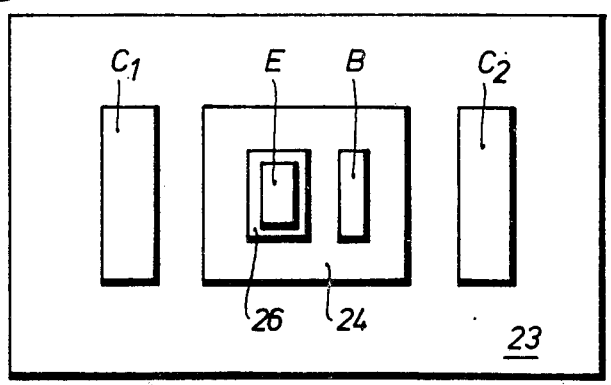
FIG. 17 is a top view of the transistor of FIG. 16.

In accordance with the present invention, the remaining, or saturation voltage which appears across the output of a load can be reduced to a fraction of the saturation voltage by forming connections to the structure such that only a portion of the resistance paths is inserted with the load when it is short-circuited. Referring to FIG. 16, which shows a structure, in general, similar to FIG. 13, and in which similar designations have been used: A vertical transistor 305 is illustrated which, to decrease the saturation voltage $U_{CEsat}$ has two collector contacting diffusion zones 28a and 28b and two external contacts $C_1$, $C_2$. The zones 28a, 28b are located at opposite sides of the base region or zone 24. Terminal $C_1$ is the input collector terminal. The additional collector terminal $C_2$, provided in accordance with the present invention, is the output collector terminal. FIG. 16 illustrates the resistances in the resistance paths. The portion of the collector resistance of collector $C_1$ which is beneath the collector terminal $C_1$ is illustrated as $r_{CC1}$; the resistance portion in the conductive layer 30 associated with terminal $C_1$ is shown at $r_{CL1}$. The portion of the collector resistance beneath the collector terminal $C_2$ is shown at $r_{CC2}$, and the portion within the conductive layer 30 associated with terminal $C_2$ is shown at $r_{CL2}$. $R_{CE}$ is a third portion of the collector resistance which is beneath the emitter E, and which is common to the two collectors $C_1$ and $C_2$. Referring now particularly to the equivalent circuit of FIG. 18: When the load 1 is connected, the saturation voltage will be in accordance with formula (5) above, if no current flows over collector terminal $C_2$. The saturation voltage of the transistor 305, in accordance with the present invention, will be practically as in a discrete transistor element, in which the collector is contacted from behind, or on the bottom, by the resistance in the path beneath the emitter and by the inner saturation voltage. When the transistor is operating in saturation by a high base current, $r_{CE}$ almost completely disappears due to the resistance modulation effect, and the voltage at the terminal practically drops to that of the inner saturation voltage, that is, to between about 50 to 100 mV.

Figure 19:
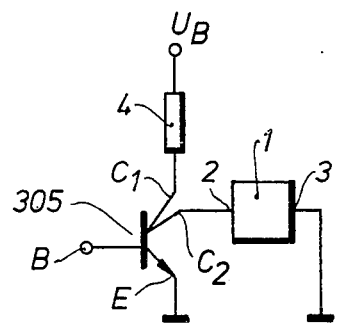
FIG. 19 is a schematic diagram illustrating, in symbolic representation, a switching transistor with two collector terminals to decrease remaining output voltages, in accordance with the invention.
Figure 20:
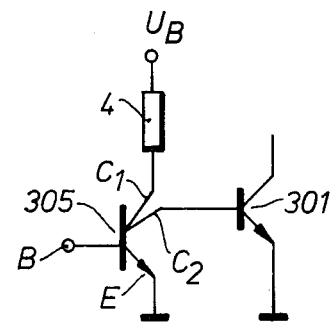
FIG. 20 is a circuit in accordance with FIG. 19.

FIG. 19 is a proposal for a symbolic representation of a transistor constructed in accordance with FIG. 16 and having two collector terminals $C_1$, $C_2$, and connected in a circuit to short-circuit a load 1. It is to be noted that this circuit, except for the use of the dual collectors $C_1$, $C_2$ is similar to the prior art circuit of FIG. 1; FIG. 20 illustrates the specific circuit, which compares with FIG. 2 of the prior art circuit. Use of the two collectors, in the structure of FIG. 16, however, results in a substantially lower remaining voltage across the load 301, when the transistor 305 is conductive, as explained above.

Figure 22:
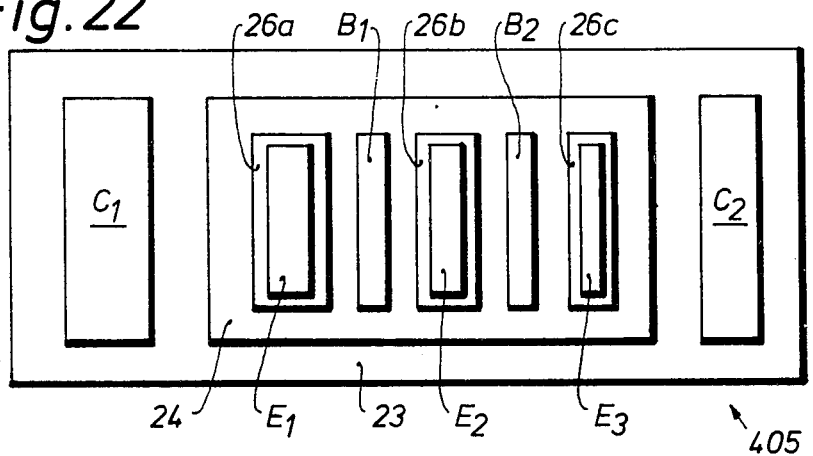
FIG. 22 is a top view of the power transistor of FIG. 21.
Figure 23:
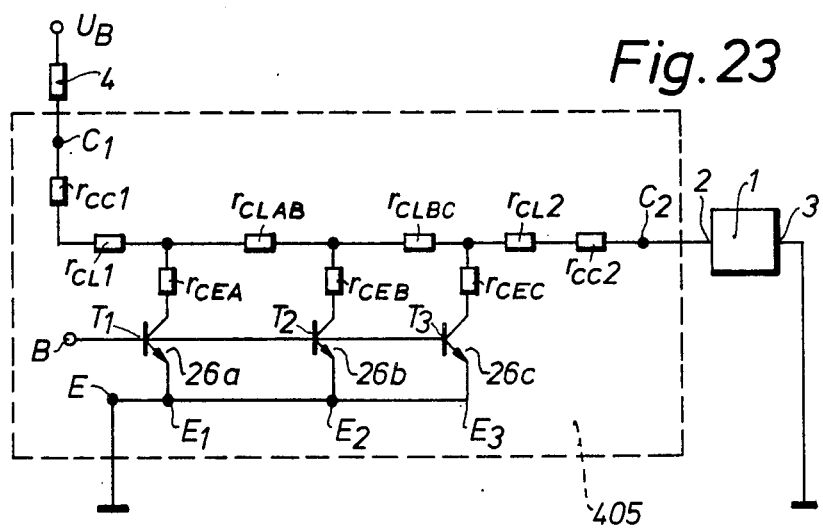
FIG. 23 is the equivalent circuit diagram of the power transistor of FIGS. 21 and 22 in the circuit of FIG. 19.
Figure 21:
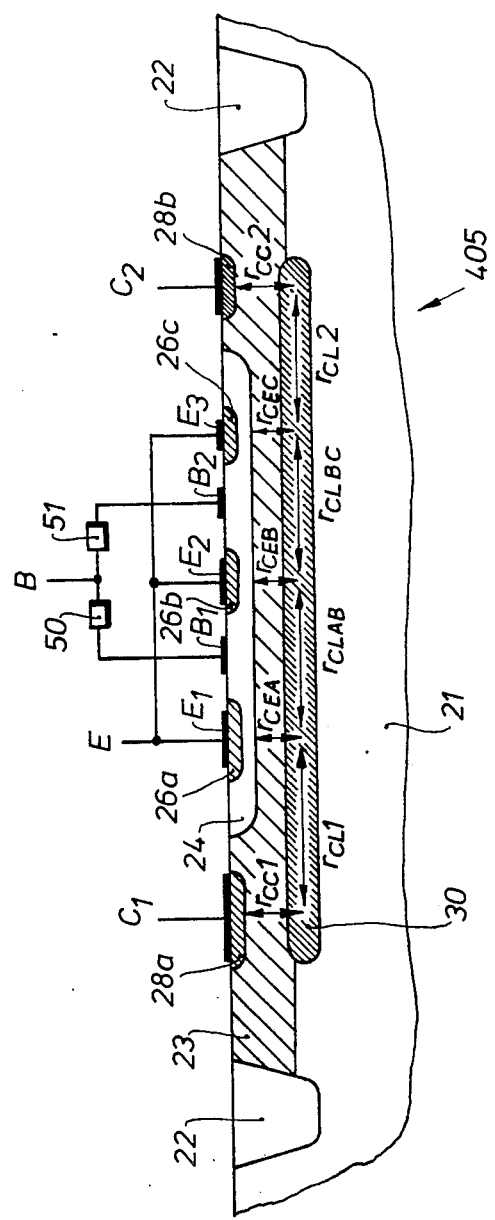
FIG. 21 is a longitudinal cross-sectional view through a vertical NPN power transistor having two collector terminals, three connected emitter terminals and two connected base terminals.

A further example of the invention is illustrated in FIGS. 21–23, to which reference will be made. A vertical NPN power transistor 405 has two collector terminals $C_1$, $C_2$, similar to the transistor 305 of FIGS. 16–20. The emitter zone of the transistor 405 is subdivided into three emitter fingers sub-zones, or 26a, 26b, 26c. These three emitter fingers have metallic terminals $E_1$, $E_2$, and $E_3$ applied thereto. The metallic terminals are interconnected to a common line, forming a common outer emitter terminal E (FIGS. 21, 23).

The base 24 of the power transistor 405 has two strip-formed base contacts $B_1$, $B_2$. The terminal $B_1$ is located between the first emitter finger 26a and the second emitter finger 26b; the terminal $B_2$ is connected between the second emitter finger 26b and the third emitter finger 26c. The base currents are sub-divided, and distributed from a common external base terminal B over respective coupling resistors 50, 51 to the terminals $B_1$ and $B_2$, respectively, of the base metal contacts.

The collector contacting diffusion zones 28a and 28b, as well as the collector terminals $C_1$ and $C_2$ are made similarly to the collector terminals $C_1$, $C_2$ of the transistor 305 (FIGS. 16–18) and, therefore, are not described again. Due to the difference in structure of FIG. 21 from FIG. 16, however, different collector resistance paths will arise; these different collector resistances are illustrated in FIG. 21 and, in equivalent circuit, in FIG. 23.

Partial transistors $T_1$, $T_2$, $T_3$ are formed, associated with the emitter fingers 26a, 26b, 26c (FIG. 23). They have associated collector-emitter resistances $r_{CEA}$, $r_{CEB}$, $r_{CEC}$ which are the resistances between the emitter finger and the conductive layer 30; $r_{CC1}$ is the resistance between the input collector $C_1$ and the conductive layer 30; $r_{CC2}$ is the resistance between the output collector $C_2$ and the conductive layer 30. The resistances in the conductive layer 30 are shown in their separate portions as follows: the section between the input collector $C_1$ and the emitter finger 26a is indicated as $r_{CL1}$; the portion between emitter finger 26a and emitter finger 26b is shown as $r_{CLAB}$; the portion between emitter finger 26b and emitter finger 26c is shown as $r_{CLEB}$; and the portion between the emitter finger 26c and the output collector $C_2$ is shown as $r_{CL2}$.

Operation: Upon energization of the base terminal B of the transistor 405, current from source $U_B$ will flow over resistor 4, forming the collector current to the input collector $C_1$. This current will then flow over the internal resistances $r_{CC1}$ and $r_{CL1}$ (FIG. 23), thereafter, the current divides, in accordance with Kirchhoff's law; the emitter finger 26a will have the most current; emitter finger 26b less, and emitter finger 26c the least. Due to this unequal current distribution, the structural dimensions, that is, the geometric form of the emitter fingers 26b, 26c may be progressively less than the emitter finger 26a. If more than two emitter fingers are used, additional emitter fingers may, each, have progressively less width (see FIG. 22). A further advantage of the embodiment in accordance with FIGS. 21–23 can be seen when considering the equivalent circuit diagram of FIG. 23, that is, the series or chain connection of the path resistances $r_{CLAB}$, $r_{CLBC}$ . . . .etc. The remaining voltage across the terminal 2 of load 1, that is the voltage between terminal $C_2$ and E, which is also the voltage to ground, is sub-divided several times, and obtained by repeated sub-division of the supply voltage $U_B$. Reference may be made to FIGS. 14 and 15. The equality of equation (6) can be so re-formulated that the remaining voltage $U_{CEsat}$ will be practically equal to the inherent saturation voltage $U_{CEsato}$, by using the collector resistance $r_C$ and the resistor 4 (FIG. 14). Similar relationships will obtain in the circuit of FIG. 23, approximately, for the first partial transistor $T_1$. The voltage division is obtained on the one hand by the resistance component $r_{CEA}$, and by the resistor 4 and the resistance component $r_{CC1}$ and $r_{CL1}$, on the other. In accordance with the principle of multiple subdivision, the voltage between the junction I and the common outer terminal E is sub-divided by the aforementioned first sub-division from the operation voltage $U_B$, in turn, by the voltage divider formed by resistors $r_{CEB}$ and $r_{CLAB}$. The junction I is the junction of the resistance components $r_{CL1}$, $r_{CEA}$ and $r_{LAB}$. By this multiple division, the inherent saturation voltage will become less and less as one progresses from one emitter finger to the next, in the direction of the second collector terminal $C_2$. In the above discussion, the loading of each part or sub-component by the subsequent component, as well as the inherent saturation voltages at the emitters have been neglected; the terms neglected are very small, however, and the multiple sub-division, resulting in a much smaller final remaining voltage across the load will still pertain.

Any one of the circuits may be made as integrated monolithic structures, even those not so shown or specifically described. Anyone of the circuits may, of course, be constructed in complementary form. For example, the circuit of FIG. 6 may be constructed in complementary manner, for example, by using a basic n-substrate. The resistor 4 (104, 204, respectively) has been shown for purposes of illustration simply as an ohmic resistance element; it may be replace by a current source, by a transistor, or other equivalent element.

Various changes and modifications may be made; features described in connection with any one embodiment may be used, similarly, with any other embodiment, within the scope of the inventive concept.

The main switching transistor 105 of the circuits of FIGS. 3–12 may be a power transistor, capable of conducting a much higher load current, when conductive, than the auxiliary switching transistor 111. The circuit is suitable for use with discrete components, as well as in integrated, monolithic form, or as a mixed circuit in which the main switching transistor 105, 205, respectively, may be a discrete element with high heat dissipating capability, whereas the auxiliary transistor 111, resistance 114, 214, respectively, and other circuit components which may form part of the load or of a control circuit, may be on a monolithic integrated circuit chip. The structure of the circuits of FIGS. 16–23, likewise, should be so arranged that the first collector $C_1$, the conductive path 30, and the second collector $C_2$ can carry full-load current demanded by the load 1 from source $U_B$; the structural arrangement of the circuit paths from the second collector $C_2$ to the emitter need not be of high current carrying capability, however, and the structural arrangement of the circuit path between the first collector $C_1$ and the emitter E need be only of sufficient current carrying capability to carry short circuit current, as limited, for example, by an external dropping resistor, which may be inherent in the chip, or connected in series with the first collector $C_1$.

Figure 18:
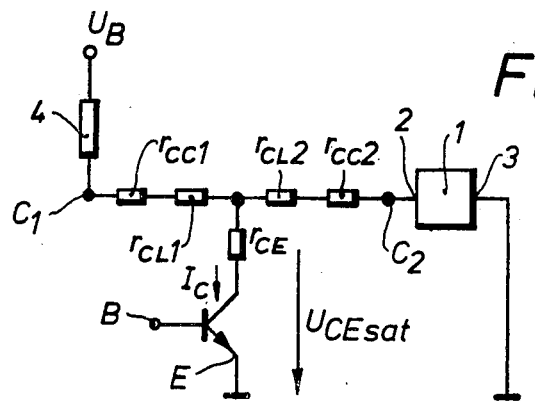
FIG. 18 is an equivalent circuit of the transistor of FIGS. 16 and 17.

We claim:

1. Switching system to short-circuit a load (1) under command of a control signal, in which the load (1) is connected to a source ($U_B$), the system having a main switch (5, 105, 205, 305, 405) connected in parallel with the terminals (6, 106, 206, B) effecting opening or closing of the switch under control of said command signal applied to the control terminal, comprising a voltage divider circuit (FIGS. 3 and 10: 14, 15; FIGS. 4, 5, 7, 8, 9, 11: 114, 115; FIG. 12: 214, 215; FIGS. 18, 19, 20: $r_{CC1}$, $r_{CL1}$ - $r_{CE}$; FIGS. 21, 22, 23: $r_{CLAB}$, $r_{CEB}$; $r_{CLBC}$, $r_{CEC}$) including two impedance means connected across the main switch electrodes (7, 8; 107, 108; 207, 208; C, E; C$_1$ - E) of the main switch, the load being connected to the voltage division, or tap point of the voltage divider circuit, the impedance means of the voltage divider circuit in parallel with the load (1) being controllable between a high, or effectively open circuit value and a low value, in synchronism with open and closed circuit condition of the main switch (5, 105, 205, 305, 405), to reduce any residual voltage applied to the load (1) due to voltage drop across the main switch electrodes of the main switch upon closing of the main switch and thus effectively short-circuiting the load.

2. System according to claim 1, wherein (FIGS. 3-12) the impedance means of the voltage divider is formed by an impedance (14, 114, 214) and the collector-emitter path of a transistor (105, 205), the load (1) being connected across the transistor;

and connection means are provided to the control electrode (106, 206) of the transistor (105, 205) to cause said transistor to become conductive in synchronism with closing of the main switch.

3. System according to claim 1, wherein (FIGS. 16-23) the impedance means of the voltage divider circuit is formed by current paths in a monolithic integrated circuit, said circuit including a transistor having two spaced collector electrodes (C$_1$, C$_2$) on a monolithic chip, and at least one emitter connection between said spaced collector electrodes, said voltage divider being formed by the current path from of the collector electrodes (C$_1$) to the emitter, or emitters, and the other electrode (C$_2$) to the emitter, or emitters, respectively, one of the collector electrodes together with a base and an emitter electrode forming said main switch, said control signal being applied to the base of the transistor to render said transistor conductive when the load is to be short-circuited.

4. Switching system to short-circuit a load (1) connected to a source (U$_B$) having a controlled main semiconductor switch (5) having its main switching terminals (7, 8) connected in parallel with the terminals (2, 3) of the load, and having a control terminal (6) effecting opening or closing of the control switch under control of a control signal applied to the control terminal (6), comprising a second semiconductor controlled switch (11) connected and controlled to switch in synchronism with said main switch (5);

and a two-terminal impedance means (14), the second semiconductor controlled switch (11) having its main switching electrodes (12, 13) connected across the terminals of the load (1) and said impedance means (14) being connected between one of the main switching electrodes (12) of the second semiconductor controlled switch (11) and hence to one terminal (2) of the load, and one of the main switching terminals of the main switch (5).

5. System according to claim 4, wherein (FIGS. 4-12) the two-terminal impedance means comprises an ohmic resistance (114, 214).

6. System according to claim 4, wherein (FIG. 4a) the two-terminal impedance means comprises a diode (114a).

7. System according to claim 4, wherein (FIG. 4b) the two-terminal impedance means comprises a Zener diode (114b).

8. System according to claim 4, wherein one of the main switching electrodes (13) of the second semiconductor switch (11) and one of the main switching electrodes (8) of the main semiconductor switch (5) are galvanically connected;

and wherein a signal distribution circuit (17) is provided, having said control signal applied thereto, the control electrodes (6, 16) of both controlled switches (5, 11) being connected to the distribution network (17) to provide for synchronous control of both switches.

9. System according to claim 8, wherein the distribution network (17) comprises a junction.

10. System according to claim 8, further comprising a pre-amplifier (19) connected in advance of the signal distribution network (17).

11. System according to claim 10, wherein (FIG. 5) the pre-amplifier (19) comprises a transistor (119) having its emitter connected to the control input (18) of the signal distribution network (17), and having its collector connected to one main terminal (7) of the main switch (5), the base of the transistor (119) forming the control input (20) of the pre-amplifier and having said control signal applied thereto.

12. System according to claim 4, wherein the main semiconductor switch (5) comprises an NPN transistor, the collector and the emitter forming, respectively, the main electrodes of the main switch, and the base forming the control electrode having the control signal applied thereto;

and wherein, in accordance with the invention, the second semiconductor controlled switch (11) comprises an NPN transistor (111), the collector (112) and the emitter (113) forming the main switching electrodes thereof, the base (116) of the second transistor forming the control electrode of the second controlled switch (11).

13. System according to claim 12, wherein (FIG. 6) the impedance means comprises an ohmic resistance (14), and the two transistors (105, 111) forming the main controlled switch and the second controlled switch (5, 11) as well as the resistance (114) are a monolithic integrated circuit.

14. System according to claim 13, wherein (FIG. 6) the monolithic circuit comprises a substrate (21) and a trough (23) formed therein, both transistors (105, 111) forming the controlled switches (5, 11) being located in said single trough (23);

a conductive layer (30) is located between the substrate (21) and the trough (23), the conductive layer being subdivided into two partial zones (30a, 30b), one zone (30a) being beneath one of the transistor structures (5) and the other (30b) being beneath the other of the transistor structures in the monolithic circuit.

15. System according to claim 14, wherein the ohmic resistance (114) is located in the same trough (23) as the transistors (105, 111).

16. System according to claim 15, wherein the ohmic resistor (114) is formed between the collector contacting diffusion zones (28, 29) of the two transistors (105, 111) and contact thereto is provided by the collector contacts (107, 112) of the transistors (105, 111).

17. System according to claim 16, wherein the ohmic resistor (114) is formed by a zone (1114) of base material in said trough.

18. System according to claim 4, wherein the impedance means comprises an ohmic resistance, and said controlled switches (5, 11), each, comprises a transistor;

and wherein (FIG. 7) a de-coupling network (17) is provided, having said control signal applied thereto and connected to the base electrodes of both said transistors, said de-coupling network comprising a resistance, each, (31, 32), connected between a control signal terminal and the respective base of the respective transistor (105, 111).

19. System according to claim 4, wherein (FIG. 8) the impedance means comprises an ohmic resistance, and the controlled semiconductor switches, each, comprise a transistor structure;

and wherein a de-coupling network (17) is provided connected between a control terminal having said control signal applied thereto and the bases of the transistors;

wherein the system is a monolithic integrated circuit in which the de-coupling network comprises a lateral transistor (33) having two collectors, one of the collectors being connected to the base of the transistor forming the main switch (105) and the other collector being connected to the base of the transistor (111) forming the second controlled switch, the emitter of the lateral transistor (33) being connected to the collector of the transistor forming the main switch (105).

20. System according to claim 19, wherein (FIG. 8) a pre-amplifier transistor (34) is provided, having its collector connected to the base of the lateral transistor (33), and its emitter connected galvanically to at least one of the emitters (108, 113) of at least one of the transistors 105, 111) forming the controlled switches;

and wherein the base of the pre-amplifier transistor (34) forms the control terminal (118) for the control signal, and for the de-coupling network.

21. System according to claim 4, wherein (FIG. 9) the controlled semiconductor switches (5, 11) comprise, each, a transistor (105, 111), a de-coupling and signal distribution network (17) is provided, connected to a control terminal (118) having the control signal applied thereto, the de-coupling and distribution network comprising complementary transistors (PNP-35; NPN-36), the emitter of one of the transistors (35) being connected to the collector (107) of the transistor (105) forming the main controlled switch (5), the collector of said transistor (35) being connected to the base of the transistor (111) forming the second control switch (11);

the collector of the second, and complementary transistor (36) being connected to the base of the first transistor (35) of the distribution network and the emitter of the second transistor (36) of the distribution network being connected to the base of the transistor (105) forming the main switch (5);

the base of the second, complementary transistor (36) being connected to the control input (118) of the de-coupling network, and having said control signal applied thereto.

22. System according to claim 4, wherein (FIG. 10) the second controlled semiconductor switch (11) has a clock electrode (16), the control electrode (16) of the second controlled switch being connected to the second main terminal (8) of the main switch (5);

the control electrode (6) of the main semiconductor switch (5) being connected to have said control signal applied thereto, and providing for synchronous switching of both said switches.

23. System according to claim 22, wherein the main switch (5) comprises a transistor (105), the main semiconductor terminals (7, 8) being formed by the collector (107) and the emitter (108) thereof, the control terminal (106) being connected to the base of said transistor (105);

and wherein the second controlled semiconductor switch (11) comprises a transistor (111), the collector (112) and the emitter (113) forming the main electrodes thereof, and the base (116) forming the control terminal (16) of the second controlled switch (11);

and wherein said transistors are of the same conductivity type.

24. System according to claim 22, wherein (FIG. 12) the main semiconductor (5) comprises a transistor of first conductivity type (PNP-205), the emitter (207) and the collector (208) forming the first and second main terminals of the main switch (5), and the base (206) of the transistor forming the control terminal (6) of the main switch;

and wherein the second controlled semiconductor switch (11) comprises a transistor of opposite conductivity (NPN-211), the collector and the emitter (212, 213) thereof forming the first and second main electrodes thereof, and the base (216) forming the control terminal (16) of the second controlled switch (11).

* * * * *

UNITED STATES PATENT AND TRADEMARK OFFICE
CERTIFICATE OF CORRECTION

PATENT NO. : 4,004,160
DATED : January 18, 1977
INVENTOR(S) : Klaus STREIT et al It is certified that error appears in the above—identified patent and that said Letters Patent are hereby corrected as shown below:

Claim 23, line 2, before "switch" please insert -- semiconductor --

Claim 23, end of line 2 onto line 3, please delete "semiconductor"

Signed and Sealed this

Fourteenth Day of June 1977

[SEAL]

Attest:

RUTH C. MASON
*Attesting Officer*

C. MARSHALL DANN
*Commissioner of Patents and Trademarks*